United States Patent [19]

Cole et al.

[11] Patent Number: 5,033,067
[45] Date of Patent: Jul. 16, 1991

[54] VARIABLE SHIFT REGISTER

[75] Inventors: Gary B. Cole, Knightdale; Michael J. Gingell, Raleigh, both of N.C.

[73] Assignee: Alcatel NA Network Systems Corp., Hickory, N.C.

[21] Appl. No.: 451,415

[22] Filed: Dec. 15, 1989

[51] Int. Cl.⁵ .................. H03K 5/13; G11C 19/00
[52] U.S. Cl. ......................... 377/54; 377/77; 377/81; 377/70; 307/602
[58] Field of Search ................ 307/602, 608; 377/54, 377/56, 75, 76, 81; 328/55, 152, 154

[56]       References Cited
       U.S. PATENT DOCUMENTS 3,786,440  1/1974  Toyen ................................ 377/54
3,887,795  6/1975  Eyrick et al. ..................... 377/56
4,016,511  4/1977  Ramsey et al. ................... 307/608
4,567,385  1/1986  Falater et al. .................... 307/463
4,777,385 10/1988  Hartmeier ......................... 328/55
4,845,390  7/1989  Chan ................................ 307/602

Primary Examiner—John S. Heyman
Attorney, Agent, or Firm—Peter C. Van Der Sluys

[57]               ABSTRACT

A variable length shift register is formed of a plurality of flip-flops arranged to form separate shift registers of different lengths. The shift registers are interconnected by multiplexers which connect either the input or the output of each shift register to the input of an adjacent shift register. Control signals are provided to the multiplexers to controllably select the length of the variable shift register by selectively inserting shift registers into the variable shift register and bypassing others.

13 Claims, 4 Drawing Sheets

VARIABLE SHIFT REGISTER

BACKGROUND OF THE INVENTION

1. Field of the Invention

The present invention relates to shift registers and more particularly, to a shift register the length of which may be varied in accordance with a control signal.

2. Description of the Prior Art

Shift registers are frequently used as delay lines for delaying a digital binary signal by a particular number of clock pulses or time slots corresponding to the length of the shift register. The signal is inputted to one end of the shift register and is clocked therethrough and provided at an output a number of clock pulses later, depending upon the length of the shift register.

There are occasions in logic design where it may be desirable to use a shift register having a variable length, the length depending on a control signal.

Normal shift registers are of a fixed length and therefore do not have the ability to provide a variable delay circuit.

SUMMARY OF THE INVENTION

The present invention contemplates a variable shift register formed of a plurality of shift registers, preferably, but not necessarily, each shift register has a different length. A multiplexer is associated with each shift register to selectively connect either the input or the output of the shift register to the input of another shift register. One of said shift registers has an input connected to receive a signal to be delayed, and one of said multiplexers provides an output of the variable shift register.

The multiplexers are controlled by a multi-bit control signal, one bit controlling each of said multiplexers. Each shift register can be either inserted into the variable shift register or bypassed by its associated multiplexer, depending upon the state of its control bit. By providing various combinations of the multi-bit control signal, the shift registers are either inserted into the variable shift register or bypassed to provide any desired length register up to the total length of all the shift registers.

A primary objective of the present invention is to provide a variable shift register, the length of which is determined by a control signal.

Another objective of the present invention is to provide a variable shift register that can function as a delay line for delaying a signal from 0 to n clock pulses, where n is any integer up to a number equal to the total length of the variable shift registers.

DESCRIPTION OF THE DRAWING

The figure is a schematic diagram of the variable shift register of the present invention.

DETAILED DESCRIPTION OF THE PREFERRED EMBODIMENT

Figure 1A:
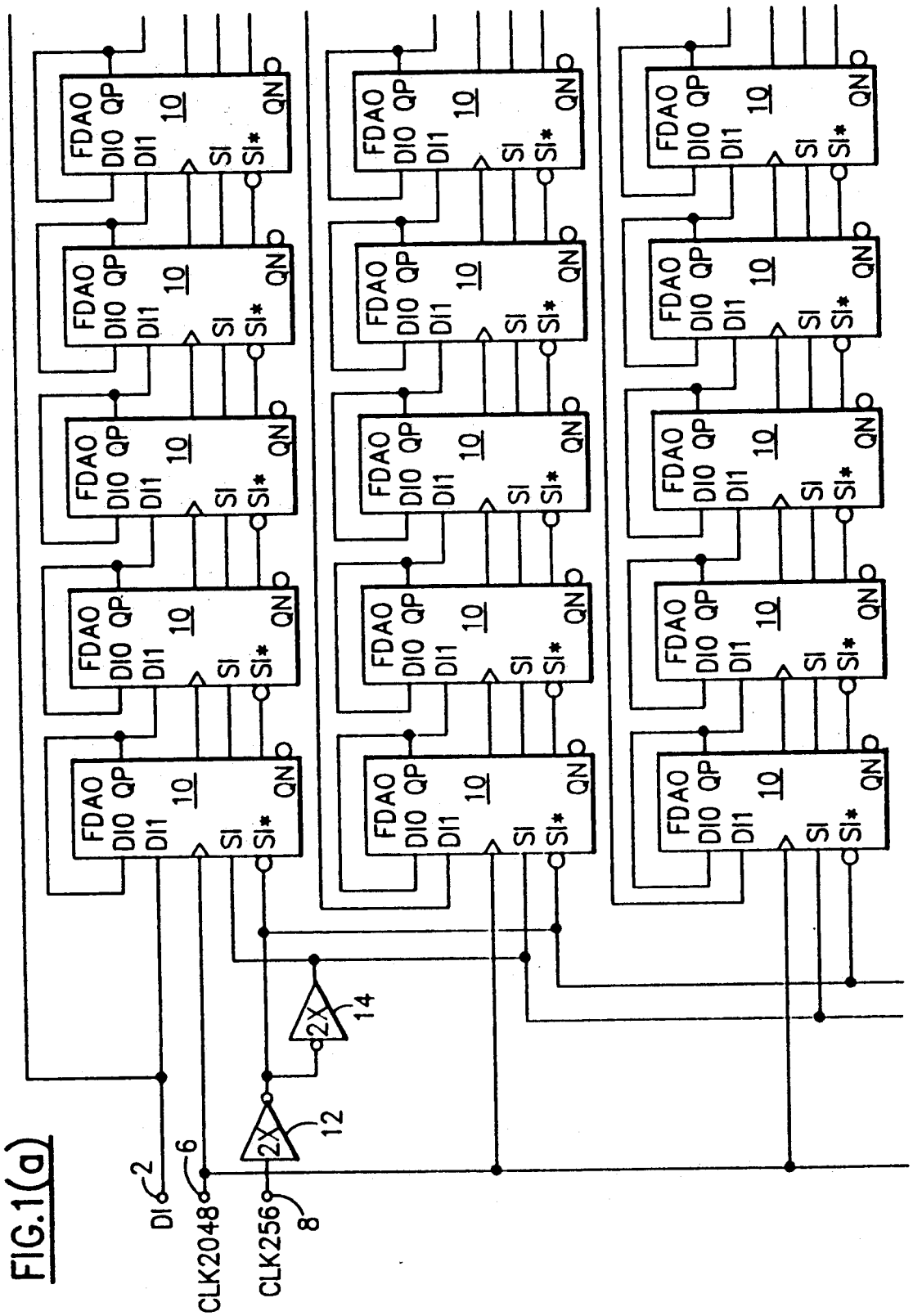
Figure 1B:
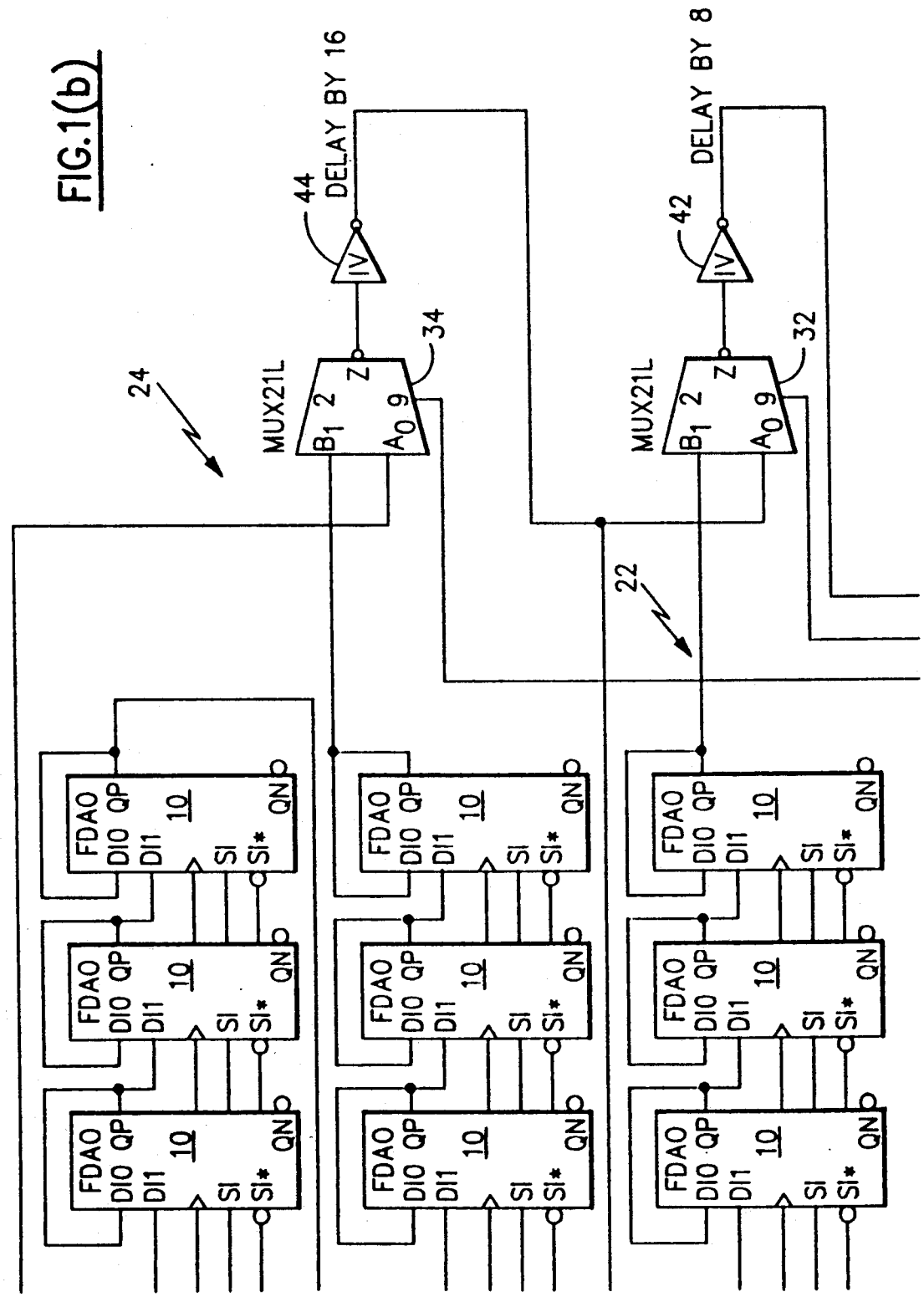
Figure 1C:
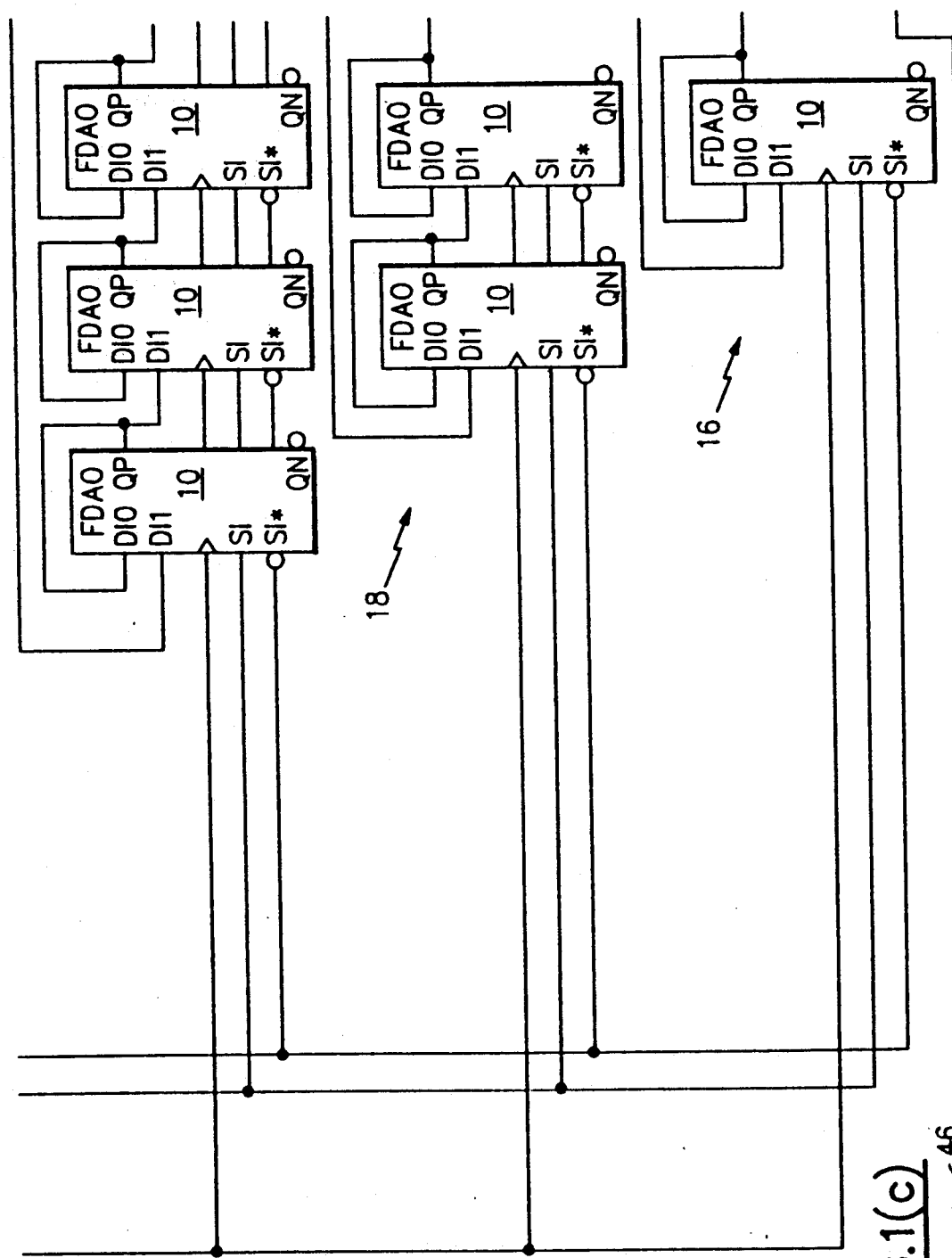
Figures 1, 1D:
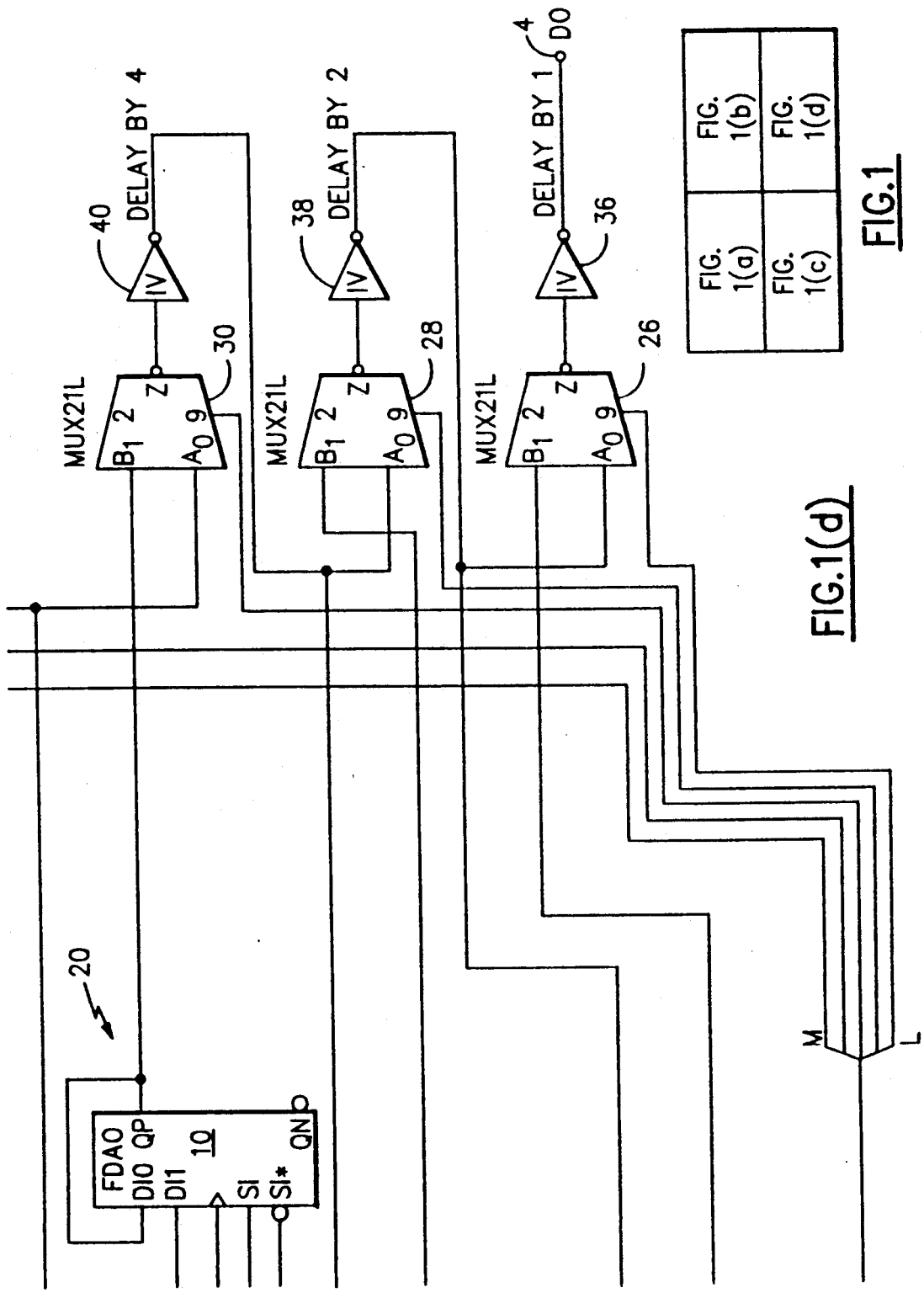

The variable shift register shown in the Figure is used to delay a signal DI, provided, to an input terminal 2, by a variable number of clock cycles and to output the signal at an output terminal 4 as signal DO. The input signal DI can be passed through the variable shift register without any delay or can be delayed a selected number of clock cycles up to a total of 31 clock cycles for the embodiment shown in the Figure.

The variable shift register comprises a plurality of two input D-type flip-flops 10 which receive a clock signal, CLK2048, which is applied to a terminal 6. In the present case CLK2048 has been selected to be 2.048 MHz. Two signals are provided to the SI and SI* input select inputs in each flip-flop 10. The signals provided to the select inputs are derived from a 256 KHz clock, CLK256, which is applied to a terminal 8 and has a one-eighth duty cycle so that the CLK256 clock provides a positive level for a period of time corresponding to the period of the CLK2048 clock. The CLK256 clock is provided to a first inverter 12, the output of which is connected to the SI* input of each flip-flop 10 and is further provided to an input of an inverter 14, the output of which is provided to the SI input of each flip-flop 10. Each flip-flop has its QP output connected back to the DI0 input. The DI1 input of each flip-flop 10 is connected to receive an input signal. During the time when the CLK256 clock is high, each flip-flop enters the signal appearing at input DI1. When CLK256 goes low, for the next seven cycles of clock, CLK2048, the output QP is fed back into the input DI0 to maintain each flip-flop at the same state.

The flip-flops 10 are arranged to form a plurality of shift registers each having a different length. The flip-flops form a one-bit shift register 16, a two-bit shift register 18, a four-bit shift register 20, and eight-bit shift register 22 and a 16-bit shift register 24. Each of the shift registers has an input connected to a first flip-flop in the shift register and an output from the last flip-flop in the shift register. The QP output of each flip-flop is connected to the next flip-flop in its shift register, except for the last flip-flop of each shift register, in which case the QP output forms the output of the shift register. The input terminal 2 is connected to the DI1 input of the first flip-flop of register 24.

Five 2-input multiplexers 26 through 34 are each associated with one of said shift registers and have a first input connected to the shift register input and a second input connected to the shift register output. Multiplexers 26 through 34 each have outputs connected to inverters 36 through 44 respectively. The multiplexers each have low outputs and thereby function to invert the signal passing through the multiplexer. The outputs of the inverters 38 through 44 are connected to the inputs of the next adjacent shift register, with the output of the inverter 36 being connected to the output terminal 4 to provide output signal D0.

Each multiplexer has a control input connected to a separate line of a five-line bus which is connected to a control input terminal 46 which receives a five-bit control signal, CONT (4 . . . 0), with the least significant bit to the most significant bit being connected to the control inputs of multiplexers 26 through 34 respectively.

Each multiplexer has the ability to connect to its output either the input or the output of its associated shift register. Thus, the multiplexer may cause the signal to pass through or totally bypass its associated shift register.

By the proper selection of the control signal, any delay from no delay to 31 clock pulses of CLK256 may be selected. For example, a control signal of 00000 would provide a delay of 0. A control signal of 10000 would provide a delay of 16 clock pulses, a control signal of 00001 would provide a delay of one clock pulse. The shift registers may be selectively combined to provide any desired delay. As for example, a control signal of 01010 would provide a delay of 10 clock pulses, since the input signal DI would pass through shift registers 22 and 18.

Thus, it can be seen how the present invention provides a variable shift register that may provide a delay from 0 to 31 cycles of clock CLK256. Any length variable shift register could conceivably be provided, for example, the next shift register would have 32 flip-flops to provide an extra 32 clock cycles of delay.

While it is preferable to have shift registers of varying length, each register being twice the length of the next smaller register, so that any length delay could be provided, it is contemplated that the various shift registers could be of the same length or any other arbitrary length that may satisfy the needs of the system with which it is used.

The described embodiment was designed for use with a 2.048 MHz system clock with the DI1 inputs being enabled at a rate of 256 KHz to accommodate a DI data rate of 256 KHz. It is to be understood that the invention is not limited to such rates. It is contemplated that single-input flip-flops could be used, with the data being clocked through the shift registers by a single CLK input.

Thus, the present invention provides a variable shift register, the length of which is determined by a control signal.

What is claimed is:

1. A variable shift register, comprising:
   a plurality of shift registers of varying lengths each having an input and an output;
   means for connecting an input signal to a first of said shift registers;
   means for providing an output signal from the output of a last of said shift registers; and
   means associated with each of said shift registers for selectively connecting only one said input or said output of each shift register, except for the output of the last shift register, to the input of a next succeeding shift register and also to a next succeeding said associated means, except for the input of the first shift register, each input of a shift register being connected to receive an input or an output from only one other shift register, whereby said plurality of shift registers may be selectively connected to be bypassed or inserted into the variable shift register.

2. A variable shift register as described in claim 1, wherein said means for selectively connecting includes means for receiving a control signal.

3. A variable shift register as described in claim 2, wherein the selective connecting means comprises a plurality of multiplexers responsive to said control signal.

4. A variable shift register as described in claim 1, wherein each said associated means is a multiplexer, said multiplexers each having only two inputs, one input connected to the input of the associated shift register and a second input connected to the output of the associated shift register, and having an output connected to an input of a next succeeding shift register.

5. A variable shift register as described in claim 4, additionally comprising a driver means connected to the output of each multiplexer.

6. A variable shift register as described in claim 5, wherein the multiplexer provides an inverted output signal and the driver means comprises an inverter.

7. A variable shift register as described in claim 2, wherein the control signal comprises a multi-bit word.

8. A variable shift register as described in claim 3, wherein the control signal comprises a multi-bit word with one bit controlling each multiplexer.

9. A variable shift register as described in claim 1, wherein no two shift registers have the same length and the smallest shift register has a length of 1, with each next larger shift register being twice the length of the next smaller shift register.

10. A variable shift register as described in claim 9, wherein the selective connecting means is responsive to a control signal and comprises a plurality of multiplexers, one multiplexer associated with each shift register.

11. A variable shift register as described in claim 10, wherein the control signal comprises a control word having a plurality of bits, one bit for controlling each multiplexer.

12. A variable shift register as described in claim 11, wherein the control word has bits arranged from the least significant bit to the most significant bit, and the bits are provided to the multiplexers associated with the smallest to the longest length, respectively.

13. A variable shift register as described in claim 1, wherein the plurality of shift registers is formed from a plurality of interconnected flip-flops, the number of flip-flops in each shift register determining the length of each shift register.

* * * * *